United States Patent
Mallinson

(10) Patent No.: US 10,784,888 B2
(45) Date of Patent: Sep. 22, 2020

(54) USE OF DIFFERENTLY DELAYED FEEDBACK TO SUPPRESS METASTABILITY IN NOISE SHAPING CONTROL LOOPS

(71) Applicant: SiliconIntervention Inc., Kelowna (CA)

(72) Inventor: A. Martin Mallinson, Kelowna (CA)

(73) Assignee: SiliconIntervention Inc., Kelowna (CA)

( * ) Notice: Subject to any disclaimer, the term of this patent is extended or adjusted under 35 U.S.C. 154(b) by 0 days.

(21) Appl. No.: 16/454,812

(22) Filed: Jun. 27, 2019

(65) Prior Publication Data
US 2020/0007147 A1 Jan. 2, 2020

Related U.S. Application Data

(60) Provisional application No. 62/691,533, filed on Jun. 28, 2018.

(51) Int. Cl.
H03M 3/00 (2006.01)
(52) U.S. Cl.
CPC ............. *H03M 3/37* (2013.01); *H03M 3/414* (2013.01); *H03M 3/438* (2013.01); *H03M 3/484* (2013.01)
(58) Field of Classification Search
None
See application file for complete search history.

(56) References Cited

U.S. PATENT DOCUMENTS

| | | | |
|---|---|---|---|
| 6,587,063 B1 * | 7/2003 | Su | H03M 3/446 341/143 |
| 7,391,350 B2 * | 6/2008 | Aldajani | H03M 3/484 341/143 |
| 2005/0068213 A1 * | 3/2005 | Fontaine | H03M 3/37 341/143 |
| 2007/0210948 A1 * | 9/2007 | Wang | H03M 3/37 341/143 |
| 2016/0126972 A1 * | 5/2016 | Chang | G06F 3/0416 345/173 |
| 2017/0077946 A1 * | 3/2017 | Christen | H03M 3/328 |

OTHER PUBLICATIONS

Author unknown, "Metastability Considerations", Xilinx Application Note, Xapp077, Jan. 1997 (Version 1.0) pp. 2-55, 57, and Peter Alfke and Brian Philofsky, "Metastable Recovery", Xilinx Application Note XAPP 094 Nov. 24, 2997 (Version 2.1), pp. 13-47, 49, (http://userweb.eng.gla.ac.uk/scott.roy/DCD3/technotes.pdf).
Richard Schrier, Analog Devices, Inc., "The Delta-Sigma Toolbox Version 7.1", Dec. 11, 2004 (read.pudn.com/downloads65/sourcecode/book/232898/delsig/DSToolbox.pdf).

* cited by examiner

*Primary Examiner* — Howard Williams
(74) *Attorney, Agent, or Firm* — Gard & Kaslow LLP

(57) ABSTRACT

Described herein is a ΣΔ modulator with improved metastability in which the control loop remains stable. In one embodiment, the ΣΔ modulator utilizes differently delayed feedback to successive integrators of the control loop to suppress metastability errors without compromising the stability of the control loop. This is accomplished by including one or more quantizers in the control loop. This technique may be applied to control loops of at least second order, i.e., having two or more integrator stages, where at least one feedback term after the first is non-zero.

21 Claims, 6 Drawing Sheets

USE OF DIFFERENTLY DELAYED FEEDBACK TO SUPPRESS METASTABILITY IN NOISE SHAPING CONTROL LOOPS

This application claims priority from Provisional Application No. 62/691,533, filed Jun. 28, 2018, which is incorporated by reference herein in its entirety.

FIELD OF THE INVENTION

The present invention relates generally to sigma-delta modulators, and more particularly to sigma-delta modulators with improved metastability.

BACKGROUND OF THE INVENTION

Quantized feedback may be used in control loops to perform analog to digital conversion. Analog to digital converters (ADCs) with such features are often known as sigma-delta ($\Sigma\Delta$) converters, or $\Sigma\Delta$ modulators, the modulator term referring to an output digital data stream having a certain symbol pattern, or modulation, imposed upon it by the control loop. The terms $\Sigma\Delta$ modulator and noise shaping control loop are often used interchangeably in the art, although the latter is more descriptive. Circuit designers often like to use such $\Sigma\Delta$ modulators as in many cases they may be simpler to design and cheaper to make than other types of ADCs.

In such a noise shaping control loop, a continuous analog signal is applied at the input, and a digital pattern representative of this signal emerges from the output. The digital signal is created by one or more quantization elements in the control loop, for example, by non-linear elements in the loop such as flip-flops or comparators that have a discrete set of non-continuous output values for any given continuous input quantity.

The $\Sigma\Delta$ modulation works by constraining a feedback parameter to one of a set of at least two specific values, and a control loop of arbitrary order ensures that the average feedback value equals the input. Instantaneous deviations from the ideal continuous feedback necessarily introduced by quantization elements represent noise, and a sophisticated, possibly high order, control loop can suppress or "shape" this noise. To "shape" the noise means to filter it, generally to make it not appear in certain frequency bands. The loop therefore operates to suppress this noise in certain frequency bands of interest, often at the expense of increased noise in bands that are not relevant to the application. Hence $\Sigma\Delta$ modulators are sometimes also referred to a "noise shaping loops."

Quantized control loops have a known problem in that the timing of the feedback may vary depending upon the metastability of the quantizing element. Metastability refers to the variation of the time needed to obtain the output of a D-type flip-flop (DFF) or similar quantizer.

In theory, a DFF receives a clock signal (commonly called "Clk") and instantaneously provides an output (known as "Q") at one of two levels, a high level if the input (known as "D") is above a certain threshold, or a low level if the D input is below the threshold. In practice, because the DFF is comprised of physical components, a finite amount of time is required to determine if the D input exceeds the threshold, and the Q output thus moves slightly after the Clk signal. This finite time delay is commonly called the "Clk-to-Q" delay.

Metastability is thus a variation in the Clk-to-Q delay of a DFF or other quantizer. One factor in such variability is that if the D input is almost exactly at the threshold level, the DFF or other quantizer is unable to rapidly determine the appropriate output level. In principle, the Clk-to-Q delay may become infinite in such situations; in practice, however, thermal agitations of the circuit will cause a decision to be made in a finite amount of time, although that finite amount of time may be much longer than the nominal Clk-to-Q delay of the quantizer.

One solution to the problem of metastability is using multiple DFFs (or other quantizers) in series. However, this introduces additional time delay between the input to the first DFF and the output of the last DFF; for example, using two DFFs will add one clock cycle to the delay. Adding delay in the control loop by cascading quantizers diminishes the phase margin necessary to ensure stability of the loop, and necessitates a reduction in loop bandwidth and a consequent reduction of performance.

For these reasons, a simple and inexpensive way of reducing metastability in $\Sigma\Delta$ modulators without reducing stability or performance may be useful.

SUMMARY OF THE INVENTION

Described herein is an apparatus and method for improving the performance of $\Sigma\Delta$ modulators by improving metastability without compromising stability of the control loop.

One embodiment describes an apparatus comprising: a first comparator configured to receive an input signal and a first feedback signal, and to generate a first error signal that is the difference between the input signal and the first feedback signal; a first integrator configured to receive and integrate the first error signal; a second comparator configured to receive the integrated error signal from the first integrator and a second feedback signal, and to generate a second error signal that is the difference between the integrated first error signal and the second feedback signal; a second integrator configured to receive and integrate the second error signal; a first quantizer configured to receive the integrated second error signal from the second integrator and to generate an output signal; a feedback loop for generating the first feedback signal and the second feedback signal, comprising: a digital to analog converter configured to receive the output signal and generate a modified output signal; a second quantizer configured to receive the modified output signal and generate a quantized modified output signal; a first weighting element configured to receive and weight the quantized modified output signal to generate the first feedback signal; a second weighting element configured to receive and weight the modified output signal to generate the second feedback signal.

Another embodiment describes an apparatus comprising: a first comparator configured to receive an input signal and a first feedback signal, and to generate a first error signal that is the difference between the input signal and the first feedback signal; a first integrator configured to receive and integrate the first error signal; a second comparator configured to receive the integrated error signal from the first integrator and a second feedback signal, and to generate a second error signal that is the difference between the integrated first error signal and the second feedback signal; a second integrator configured to receive and integrate the second error signal; a third comparator configured to receive the integrated error signal from the second integrator and a third feedback signal, and to generate a third error signal that is the difference between the integrated second error signal and the third feedback signal; a third integrator configured to receive and integrate the third error signal; a first quantizer configured to receive the integrated third error signal from the third integrator and to generate an output signal; a feedback loop for generating the first feedback signal and the second feedback signal, comprising: a digital to analog converter configured to receive the output signal and generate a modified output signal; a second quantizer configured to receive the modified output signal and generate a quantized modified output signal; a first weighting element configured to receive and weight the quantized modified output signal to generate the first feedback signal; a second weighting element configured to receive and weight the quantized modified output signal to generate the second feedback signal; a third weighting element configured to receive and weight the modified output signal to generate the third feedback signal.

Still another embodiment describes an apparatus comprising: a first comparator configured to receive an input signal and a first feedback signal, and to generate a first error signal that is the difference between the input signal and the first feedback signal; a first integrator configured to receive and integrate the first error signal; a second comparator configured to receive the integrated error signal from the first integrator and a second feedback signal, and to generate a second error signal that is the difference between the integrated first error signal and the second feedback signal; a second integrator configured to receive and integrate the second error signal; a third comparator configured to receive the integrated error signal from the second integrator and a third feedback signal, and to generate a third error signal that is the difference between the integrated second error signal and the third feedback signal; a third integrator configured to receive and integrate the third error signal; a first quantizer configured to receive the integrated third error signal from the third integrator and to generate an output signal; a feedback loop for generating the first feedback signal and the second feedback signal, comprising: a digital to analog converter configured to receive the output signal and generate a modified output signal; a second quantizer configured to receive the modified output signal and generate a quantized modified output signal; a third quantizer configured to receive the quantized modified output signal and generate a further quantized modified output signal; a first weighting element configured to receive and weight the further quantized modified output signal to generate the first feedback signal; a second weighting element configured to receive and weight the quantized modified output signal to generate the second feedback signal; a third weighting element configured to receive and weight the modified output signal to generate the third feedback signal.

DETAILED DESCRIPTION OF THE INVENTION

Described herein is a ΣΔ modulator with improved metastability in which the control loop remains stable. In one embodiment, the ΣΔ modulator utilizes differently delayed feedback to successive integrators of the control loop to suppress metastability errors without compromising the stability of the control loop. This is accomplished by including one or more quantizers in the control loop. This technique can be applied to control loops of at least second order, i.e., having two or more integrator stages, where at least one feedback term after the first is non-zero.

A ΣΔ loop quantizes the feedback, both in time and in amplitude. That is, the feedback is forced to a particular level, and held at that level for a defined period of time. The average of the quantized values is balanced against the continuous input value; however, this only works if the defined period of time of each quantized value is the same. Commonly, that defined period of time is the interval from one clock cycle to the next. More specifically, since the feedback is connected to the Q output of a quantizer clocked by the clock, that finite held period of time is from one Clk-to-Q output to the next Clk-to-Q output. If either of those Clk-to-Q outputs are not the same, then the hold times of the feedback signal will differ from cycle to cycle.

ΣΔ modulators that depend upon the integral of the quantized level over time will show an error due to this variation in Clk-to-Q time. As above, the effect of metastability can be greatly reduced if multiple DFFs in series are used. This is because the probability that the output of a DFF is at precisely the same metastable point as its input is very low, and so, even if a first DFF in a chain is in a metastable state, a second DFF in the chain is unlikely to also be in a metastable state. This characteristic of multiple DFFs in series is known in the prior art; see, for example, Xilinx Application Note XAPP077, "Metastability Considerations," January 1997, Version 1.0.

Figure 1:
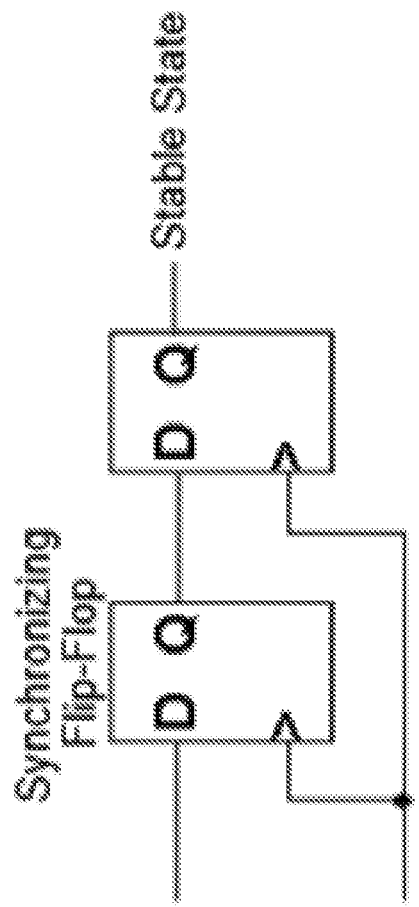
FIG. 1 is a diagram of a pair of D-type flip flops (DFFs) in sequence as is known in the prior art.

FIG. 1 (which is FIG. 3 from the cited Xilinx reference at page 2-57) illustrates how two DFFs may be placed in series in this way to obtain a stable output state.

However, also as above, cascading DFFs (i.e., connecting DFFs in series) creates a problem in that the time delay from the first DFF input to the last DFF output is now at least one clock cycle, so that stabilizing the control loop of a ΣΔ modulator by using a chain of DFFs, or other quantizers that have at least one clock delay in them, requires a reduction in loop bandwidth and thus in performance of the circuit.

Further, when optimized, ΣΔ modulators operate at the edge of stability, and each clock cycle delay caused by adding another DFF adds phase delay instability to the circuit. (As is known in the art, this is different than the metastability of the DFFs.) Thus, the issue becomes how to cure the metastability problem without ruining the stability of the control loop.

Examples of higher-order ΣΔ modulators may be found in R. Schreier, The Delta-Sigma Design Toolbox Version 7.1, Analog Devices, Dec. 11, 2004.

Figure 2:
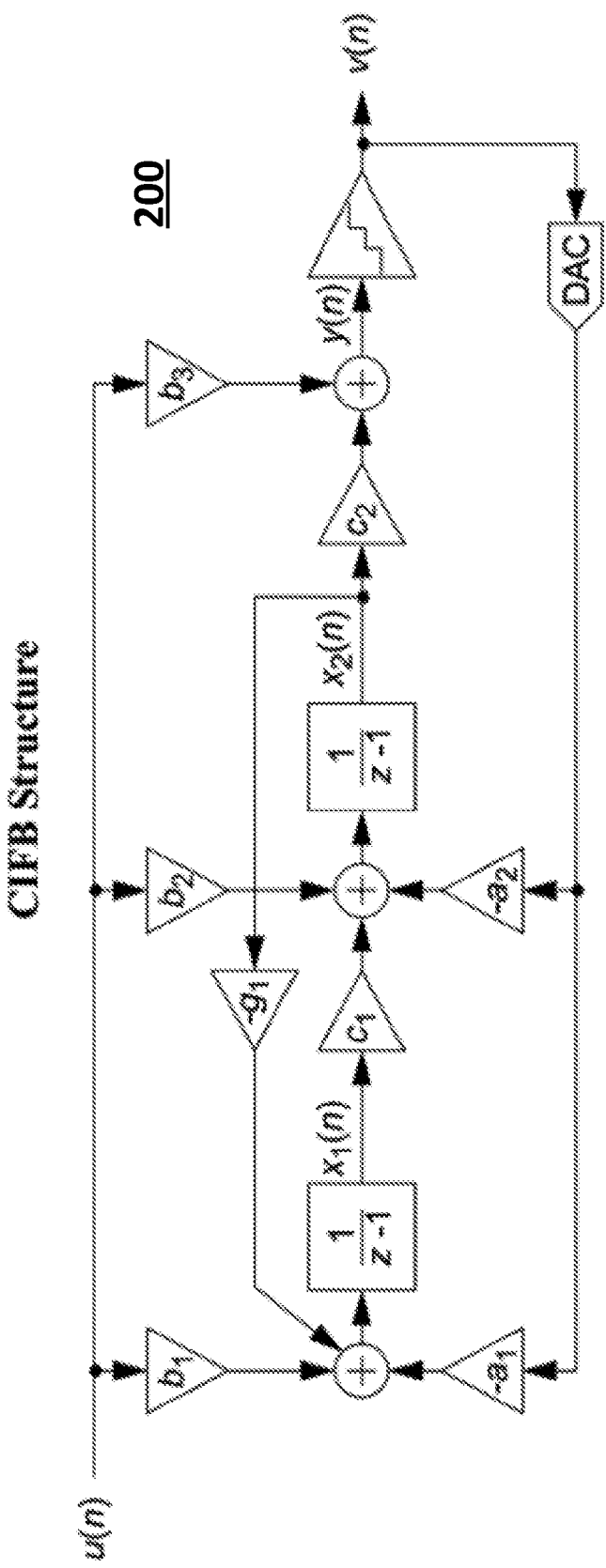
FIG. 2 is a diagram of a typical higher-order ΣΔ modulator as is known in the prior art.

Circuit 200 of FIG. 2 illustrates a typical ΣΔ higher-order modulator known in the art (this is the CIFB (cascade of integrators feedback) even-order circuit from page 21 of The Delta-Sigma Design Toolbox).

As is known in the art, in such a ΣΔ modulator an input signal u(n) is applied and compared at various points by comparators to fed-back, weighted signals. (As used herein, the term "comparator" includes any type of comparator, adder, summer, or differencing element; one of skill in the art will appreciate when the use of certain devices requires the feedback signals to be inverted to obtain a comparison, as indicated in FIG. 2.) In circuit 200 two feedback signals are created by passing the output signal v(n) through a digital to analog converter ("DAC") and weighting them by weighting elements a1 and a2. (Another fed-back interim signal, g1, inserts a zero to limit noise, and may be ignored here.) The results of each comparison, which represent errors in the signal, are integrated, and the final result quantized to generate the output signal. The DAC in the feedback path has as many output levels as the quantizer in the forward path. (Amplifiers c1 and c2 allow for desired coefficients; these coefficients are often 1.)

As is also well known, the ΣΔ modulator may be of higher order than shown in FIG. 2, i.e., there may be more integrators and taps at which the fed-back output signal is weighted and compared to the signal as it is processed. In some embodiments, the input signal may only be applied to the front end of circuit 200 as input 131, and inputs b2 and b3 may thus be zero.

ΣΔ modulators such as circuit 200 satisfy the conditions stated above for the use of the described technique for reducing metastability; that is, it has at least two integrators, and at least one feedback term after the first is non-zero (this implies that both the a1 and a2 feedback terms are not zero).

Given these conditions, in the described embodiments, to reduce metastability, one or more quantizers are added to some, but not all, of the feedback terms, such that at least one of the feedback terms has no additional time delay.

Figure 3:
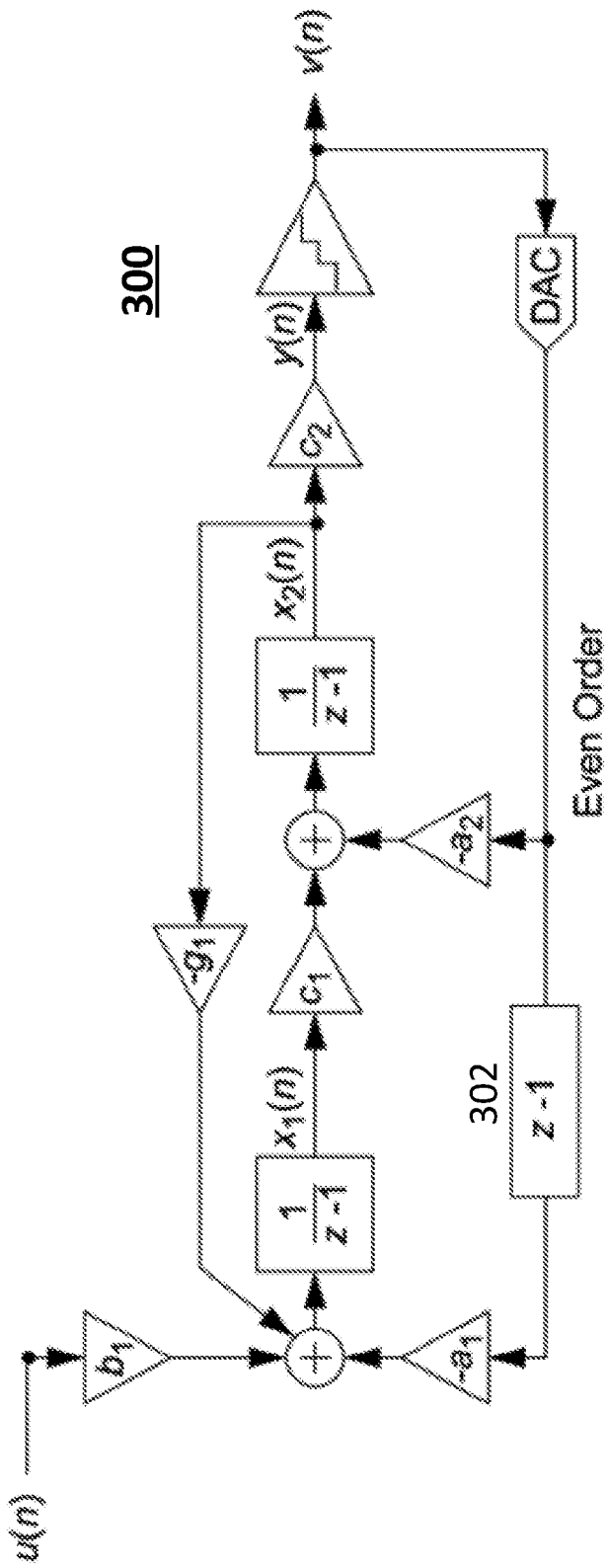
FIG. 3 is a diagram of a ΣΔ modulator with improved metastability according to one embodiment.

FIG. 3 is a circuit diagram illustrating one embodiment of the present approach in which a higher-order ΣΔ modulator 300 has a single metastability reducing quantizer in the control loop. The illustrated embodiment of circuit 300 is similar to that of circuit 200 of FIG. 2, with at least two significant differences. First, the inputs b2 and b3 are here assumed to be zero as mentioned above, and are thus not present in FIG. 3. (Again, the fed-back signal g1, while shown, is for noise purposes and may be ignored for the present approach.)

In addition, a quantizer 302 is placed in the control loop. Since the a1 feedback term is the one against which the input 131 is balanced, i.e., compared to, this is where feedback is desired that is free from metastability, and so the quantizer is added before the a1 weighting element as shown.

It is the output of quantizer 302, which is a "delayed" quantizer like the second DFF in FIG. 1, that is compared to the initial input signal M. As in FIG. 1, there are now two quantizers in the circuit; since the metastability of quantizer 302, i.e., the second quantizer, is low, the error in circuit 300 due to metastability is greatly reduced, also as in FIG. 1.

As above, it is also important that the stability of the control loop be maintained. Stability of the loop is largely controlled by the value of the higher order terms, such as the value of weighting element a2 in circuit 300, which have no delay and act as a damping factor in the control loop. Generally, elements following the first integrator are used to control the loop stability, as the feedback to successive integrator stages is used to control the phase shift near the cross-over and so optimize the closed-loop bandwidth and gain.

Elements following the first integrator (e.g., the a2 term in the circuit 300) will suffer from metastability, since these elements do not benefit from the cascade of quantizers; thus, metastability may be present at the input to quantizer 302, but suppressed at the output of quantizer 302). However, while metastability in the elements following the first integrator does not greatly diminish the phase and damping characteristics of the loop, it would greatly affect the accuracy of circuit 300 if it were present at the first integrator input.

The effect of metastability in the control loop after the first integrator has a reduced effect on the overall accuracy. This can be appreciated by observing that the term a2 in circuit 300 is balancing the integral of the input; an error at this point in the loop, referred back to the input, is thus differentiated. Any effect of metastability present at the output of a2 in circuit 300, when referred to the input, has a decreasing impact versus frequency. Consequently, metastability in a2 is "shaped" in its impact on the signal transfer characteristic in a way similar to the noise shaping of the loop. Specifically, metastability at the a2 output is first-order noise shaped into the signal band.

The output levels of DAC are discrete, and the voltages used by quantizer 302 are offset from the DAC outputs, so there is no metastability in quantizer 302. If the outputs of DAC are either 0 or 1, quantizer 302 may be as simple as a DFF.

Figure 4:
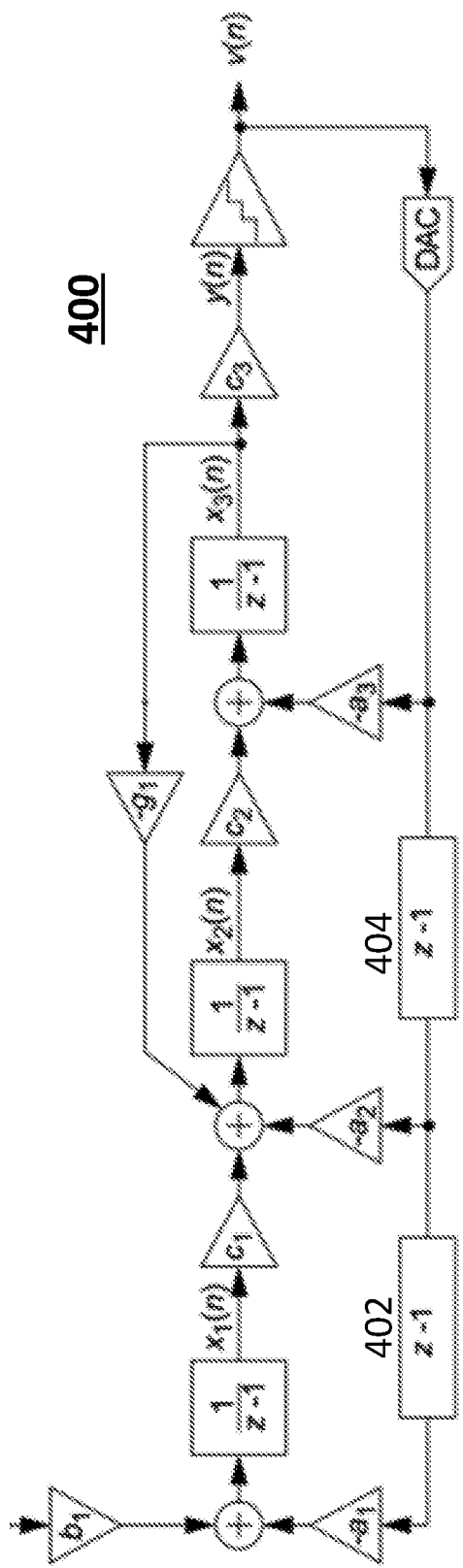
FIG. 4 is a diagram of a ΣΔ modulator with improved metastability according to another embodiment.

FIG. 4 is a circuit diagram of a third-order ΣΔ modulator 400 of the present approach in which the described technique is again used to greatly reduce the metastability. In general, a higher-order control loop will result in greater suppression of quantizer noise.

In circuit 400 there are two additional quantizers 402 and 404 in the control loop, thus creating two additional delays to the input stage where comparison to the signal takes place; quantizer 402 is located before the a1 feedback term, and quantizer 404 is located before the a2 feedback term.

Metastability present at the a3 output is now referred to the input via two integrators, since the signal at a3 is adding to the second integral of the input. Consequently, the metastability error referred to the input is now second-order noise shaped, greatly suppressing any effect of metastability. The already much improved metastability present at the output of quantizer 404 is suppressed by a first order, as described above with respect to circuit 300 of FIG. 3. Due to the cascade of three quantizers, i.e., the DAC, quantizer 404 and quantizer 402, there is essentially no metastability at all at the first integrator input. In practice, element 402 may be omitted since two cascaded quantizers are usually considered sufficient to remove any metastability.

As in circuit 300, in circuit 400 it is assumed that inputs b2 and higher are zero and thus not shown in FIG. 4. However, while performance of a ΣΔ modulator is generally higher if the control loop has non-zero feedforward stages into only those integrators that are preceded by an additional quantizer in the feedback, this need not be the case.

Figure 5:
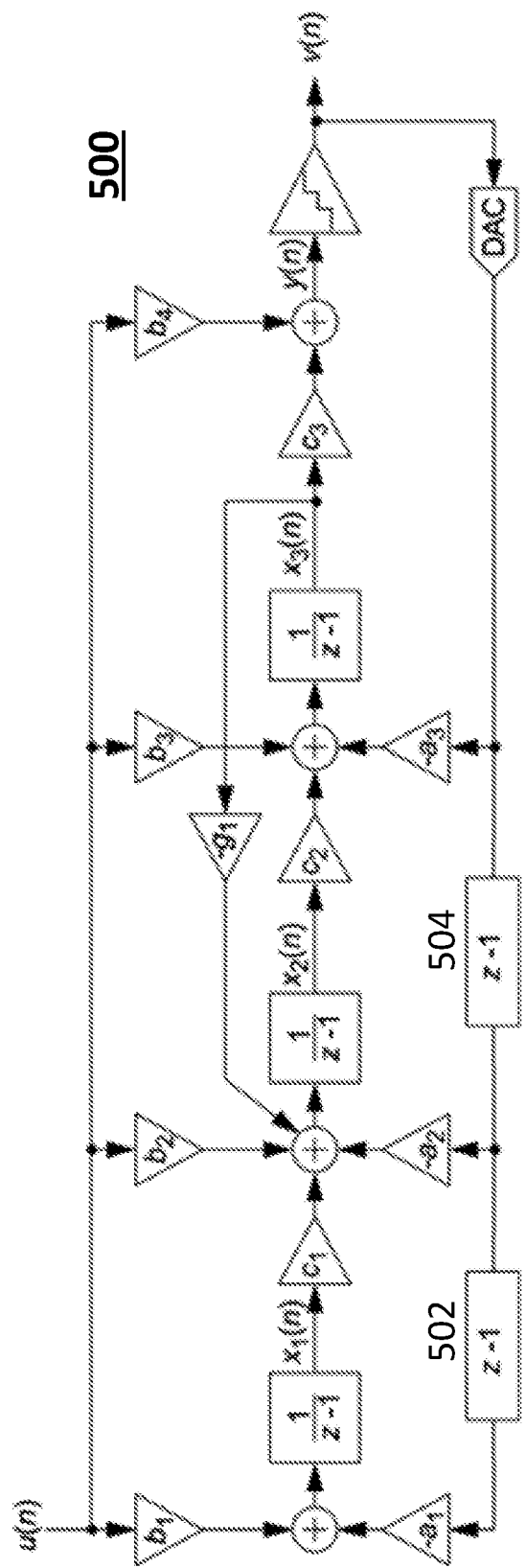
FIG. 5 is a diagram of a ΣΔ modulator with improved metastability according to yet another embodiment.

FIG. 5 is a circuit diagram of a third-order ΣΔ modulator 500 of the present approach in which the b2 and higher feedforward stages are non-zero, with two additional quantizers 502 and 504 in the control loop. Note that any non-zero feedforward terms applied to integrators that have an additional delay will benefit from metastability reduction.

However, feedforward term b4 will not benefit from metastability reduction, as it feeds an integrator that does not have an additional delay element in its feedback path. Nonetheless, since the input signal is not applied entirely via b4, the use of quantizers 502 and 504 reduces the metastability problem to some extent.

By using this technique, it is possible to construct a ΣΔ modulator that mitigates metastability without destabilizing the control loop. One of skill in the art will appreciate that a ΣΔ modulator of any order may be constructed according to the principles and approach described herein.

Figure 6:
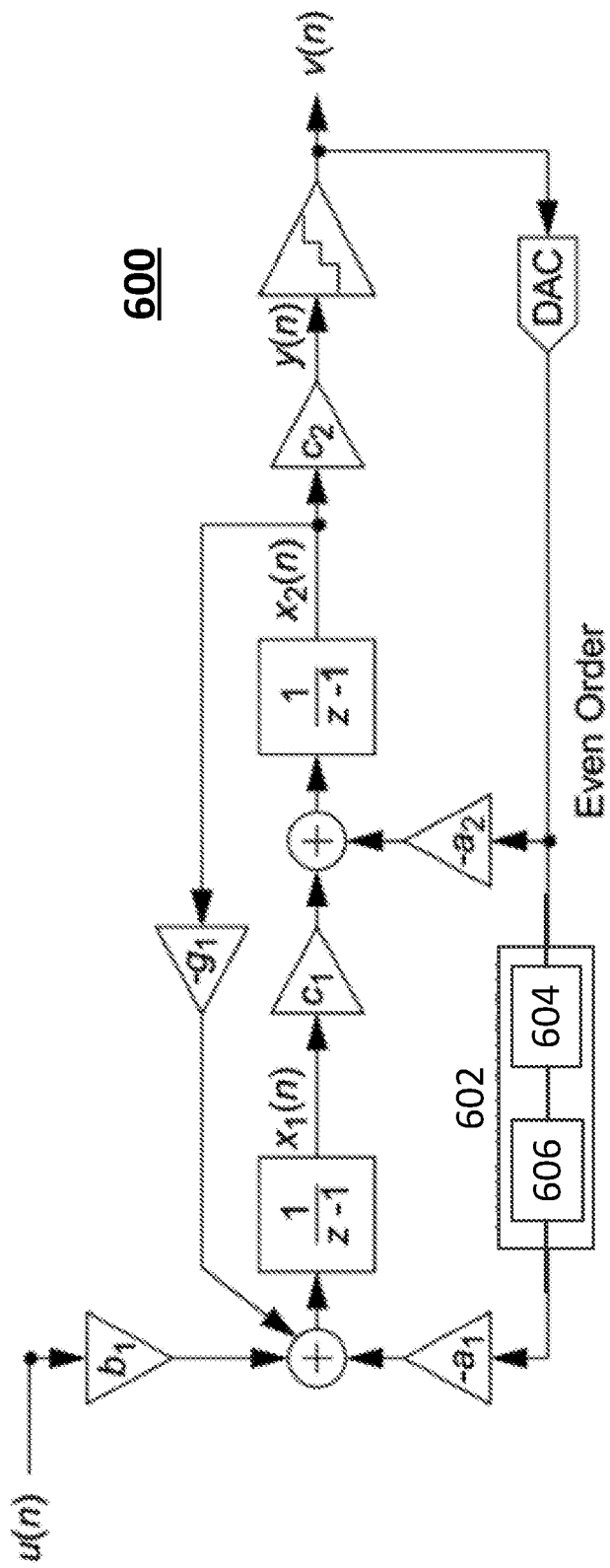
FIG. 6 is a diagram of a ΣΔ modulator with improved metastability according to still another embodiment.

The specific components that may be used in a ΣΔ modulator are known in the art. Various types of clocks capable of generating clock signals of different phases are available, as are various devices suitable for use as quantizers. For example, a flip-flop may be used as a simple quantizer; a comparator will more accurately quantize the input level, but will typically still provide its output to a flip-flop to hold the output value for the appropriate period of time. This is shown in FIG. 6, which is a circuit diagram of a ΣΔ modulator 600 that is the same as ΣΔ modulator 300 of FIG. 3, except that the quantizer in the feedback loop, quantizer 302 in FIG. 3, is replaced by quantizer 602 that includes a comparator 604 and a flip-flop 606. Integrators may be switched capacitor integrators or other known devices. Other choices will be apparent to those of skill in the art in light of the teachings herein.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art. Further, the illustration of the feedback loops, integrators, quantizers, etc., is exemplary; one of skill in the art will be able to select the appropriate type and number of elements that is appropriate for a particular application.

These and other variations upon the embodiments are intended to be covered by the present disclosure, which is limited only by the appended claims.

What is claimed is:

1. An apparatus, comprising:
   a first comparator configured to receive an input signal and a first feedback signal, and to generate a first error signal that is the difference between the input signal and the first feedback signal;
   a first integrator configured to receive and integrate the first error signal;
   a second comparator configured to receive the integrated error signal from the first integrator and a second feedback signal, and to generate a second error signal that is the difference between the integrated first error signal and the second feedback signal;
   a second integrator configured to receive and integrate the second error signal;
   a first quantizer configured to receive the integrated second error signal from the second integrator and to generate an output signal;
   a feedback loop for generating the first feedback signal and the second feedback signal, comprising:
      a digital to analog converter configured to receive the output signal and generate a modified output signal;
      a second quantizer configured to receive the modified output signal and generate a quantized modified output signal;
      a first weighting element configured to receive and weight the quantized modified output signal to generate the first feedback signal;
      a second weighting element configured to receive and weight the modified output signal to generate the second feedback signal.

2. The apparatus of claim 1 wherein the second quantizer comprises a flip-flop.

3. The apparatus of claim 1 wherein the second quantizer comprises a comparator, adder, summer, or differencing element, and a flip-flop.

4. The apparatus of claim 1 wherein the first integrator is a switched capacitor integrator.

5. The apparatus of claim 1 wherein the second integrator is a switched capacitor integrator.

6. The apparatus of claim 1 further comprising a third weighting element configured to receive and weight the input signal to generate a weighted input signal, and wherein the second comparator is further configured to receive the weighted input signal and add the weighted input signal to the difference between the integrated first error signal and the second feedback signal to generate the second error signal.

7. The apparatus of claim 1 further comprising:
   a third weighting element configured to receive and weight the input signal to generate a weighted input signal; and an adder configured to add the weighted input signal to the integrated second error signal before the integrated second error signal is received and quantized by the first quantizer.

8. An apparatus, comprising:
   a first comparator configured to receive an input signal and a first feedback signal, and to generate a first error signal that is the difference between the input signal and the first feedback signal;
   a first integrator configured to receive and integrate the first error signal;
   a second comparator configured to receive the integrated error signal from the first integrator and a second feedback signal, and to generate a second error signal that is the difference between the integrated first error signal and the second feedback signal;
   a second integrator configured to receive and integrate the second error signal;
   a third comparator configured to receive the integrated error signal from the second integrator and a third feedback signal, and to generate a third error signal that is the difference between the integrated second error signal and the third feedback signal;
   a third integrator configured to receive and integrate the third error signal;
   a first quantizer configured to receive the integrated third error signal from the third integrator and to generate an output signal;
   a feedback loop for generating the first feedback signal and the second feedback signal, comprising:
      a digital to analog converter configured to receive the output signal and generate a modified output signal;
      a second quantizer configured to receive the modified output signal and generate a quantized modified output signal;
      a first weighting element configured to receive and weight the quantized modified output signal to generate the first feedback signal;
      a second weighting element configured to receive and weight the quantized modified output signal to generate the second feedback signal;
      a third weighting element configured to receive and weight the modified output signal to generate the third feedback signal.

9. The apparatus of claim 8 wherein the second quantizer comprises a flip-flop.

10. The apparatus of claim 8 wherein the second quantizer comprises a comparator, adder, summer, or differencing element, and a flip-flop.

11. The apparatus of claim 8 wherein one or more of the first, second and third integrators are switched capacitor integrators.

12. The apparatus of claim 8 further comprising a fourth weighting element configured to receive and weight the input signal to generate a weighted input signal, and wherein the second comparator is further configured to receive the weighted input signal and add the weighted input signal to the difference between the integrated first error signal and the second feedback signal to generate the second error signal.

13. The apparatus of claim 8 further comprising a fourth weighting element configured to receive and weight the input signal to generate a weighted input signal, and wherein the third comparator is further configured to receive the weighted input signal and add the weighted input signal to the difference between the integrated second error signal and the third feedback signal to generate the second error signal.

14. The apparatus of claim 8 further comprising:
a fourth weighting element configured to receive and weight the input signal to generate a first weighted input signal;
a fifth weighting element configured to receive and weight the input signal to generate a second weighted input signal;
and wherein;
the second comparator is further configured to receive the first weighted input signal and add the first weighted input signal to the difference between the integrated first error signal and the second feedback signal to generate the second error signal; and
the third comparator is further configured to receive the second weighted input signal and add the second weighted input signal to the difference between the integrated second error signal and the third feedback signal to generate the third error signal.

15. An apparatus, comprising:
a first comparator configured to receive an input signal and a first feedback signal, and to generate a first error signal that is the difference between the input signal and the first feedback signal;
a first integrator configured to receive and integrate the first error signal;
a second comparator configured to receive the integrated error signal from the first integrator and a second feedback signal, and to generate a second error signal that is the difference between the integrated first error signal and the second feedback signal;
a second integrator configured to receive and integrate the second error signal;
a third comparator configured to receive the integrated error signal from the second integrator and a third feedback signal, and to generate a third error signal that is the difference between the integrated second error signal and the third feedback signal;
a third integrator configured to receive and integrate the third error signal;
a first quantizer configured to receive the integrated third error signal from the third integrator and to generate an output signal;
a feedback loop for generating the first feedback signal and the second feedback signal, comprising:
a digital to analog converter configured to receive the output signal and generate a modified output signal;
a second quantizer configured to receive the modified output signal and generate a quantized modified output signal;
a third quantizer configured to receive the quantized modified output signal and generate a further quantized modified output signal;
a first weighting element configured to receive and weight the further quantized modified output signal to generate the first feedback signal;
a second weighting element configured to receive and weight the quantized modified output signal to generate the second feedback signal;
a third weighting element configured to receive and weight the modified output signal to generate the third feedback signal.

16. The apparatus of claim 15 wherein either or both of the second and third quantizers comprise a flip-flop.

17. The apparatus of claim 15 wherein either or both of the second and third quantizers comprise a comparator, adder, summer, or differencing element, and a flip-flop.

18. The apparatus of claim 15 wherein one or more of the first, second and third integrators are switched capacitor integrators.

19. The apparatus of claim 15 further comprising a fourth weighting element configured to receive and weight the input signal to generate a weighted input signal, and wherein the second comparator is further configured to receive the weighted input signal and add the weighted input signal to the difference between the integrated first error signal and the second feedback signal to generate the second error signal.

20. The apparatus of claim 15 further comprising a fourth weighting element configured to receive and weight the input signal to generate a weighted input signal, and wherein the third comparator is further configured to receive the weighted input signal and add the weighted input signal to the difference between the integrated second error signal and the third feedback signal to generate the second error signal.

21. The apparatus of claim 15 further comprising:
a fourth weighting element configured to receive and weight the input signal to generate a first weighted input signal;
a fifth weighting element configured to receive and weight the input signal to generate a second weighted input signal;
and wherein;
the second comparator is further configured to receive the first weighted input signal and add the first weighted input signal to the difference between the integrated first error signal and the second feedback signal to generate the second error signal; and
the third comparator is further configured to receive the second weighted input signal and add the second weighted input signal to the difference between the integrated second error signal and the third feedback signal to generate the third error signal.

* * * * *